(12) United States Patent  
Luedeke et al.

(10) Patent No.: US 8,841,946 B2  
(45) Date of Patent: Sep. 23, 2014

(54) ELECTRONIC CIRCUIT, SAFETY CRITICAL SYSTEM, AND METHOD FOR PROVIDING A RESET SIGNAL

(75) Inventors: Thomas Luedeke, Oberbergkirchen (DE); Joachim Kruecken, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/810,000

(22) PCT Filed: Jul. 20, 2010

(86) PCT No.: PCT/IB2010/053305  
§ 371 (c)(1),  
(2), (4) Date: Jan. 14, 2013

(87) PCT Pub. No.: WO2012/010926  
PCT Pub. Date: Jan. 26, 2012

(65) Prior Publication Data  
US 2013/0113531 A1    May 9, 2013

(51) Int. Cl.  
*H03K 4/06*    (2006.01)  
*G06F 1/24*    (2006.01)  
*H03L 7/00*    (2006.01)

(52) U.S. Cl.  
CPC ... *H03L 7/00* (2013.01); *G06F 1/24* (2013.01)  
USPC ............................. 327/142; 327/143; 327/198

(58) Field of Classification Search  
USPC .......................................... 327/142, 143, 198  
See application file for complete search history.

(56) References Cited

U.S. PATENT DOCUMENTS

| | | | |
|---|---|---|---|
| 6,237,090 B1 | 5/2001 | Alavoine | |
| 6,529,053 B2 | 3/2003 | Jensen | |
| 7,405,602 B2* | 7/2008 | Saitou | 327/142 |
| 7,449,926 B2* | 11/2008 | Sakai et al. | 327/142 |
| 7,626,420 B1 | 12/2009 | Cohen | |
| 7,679,411 B2* | 3/2010 | Sakai et al. | 327/142 |
| 2006/0103436 A1* | 5/2006 | Saitou | 327/142 |
| 2009/0079476 A1* | 3/2009 | Sakai et al. | 327/142 |
| 2009/0302892 A1 | 12/2009 | Waldrop | |
| 2013/0271189 A1* | 10/2013 | Itoh | 327/142 |

OTHER PUBLICATIONS

International Search Report and Written Opinion correlating to PCT/IB2010/053305 dated Apr. 20, 2011.

* cited by examiner

*Primary Examiner* — Brandon S Cole (57) ABSTRACT

An electronic circuit comprises a reset input for receiving an input reset signal, a clock input for receiving a clock signal, and a reset output for providing an output reset signal. And it comprises a synchronous reset signal path comprising a synchronization unit, arranged to receive the input reset signal and provide the input reset signal synchronized with the clock signal to the reset output when the clock signal is available, and an asynchronous reset signal path arranged to provide the input reset signal to the reset output when a current clock availability information in a clock monitoring signal indicates that the clock signal is not available.

20 Claims, 5 Drawing Sheets

ELECTRONIC CIRCUIT, SAFETY CRITICAL SYSTEM, AND METHOD FOR PROVIDING A RESET SIGNAL

FIELD OF THE INVENTION

This invention relates to an electronic circuit, a safety critical system and a method for providing a reset signal.

BACKGROUND OF THE INVENTION

The ability for an electronic device for resetting itself in case of error or abnormal power loss can for example be observed with electronics such as a television or audio equipment or the electronics of a car or other vehicle, which are designed to function as intended again after having lost power suddenly. A sudden and strange error with a device might sometimes be fixed by removing and restoring power, making the device reset.

Processing devices, such as microcontroller units (MCU), use a reset to properly start or return to a known state in case of problems with, for example, the internal state machine. This may for example be relevant for safety critical systems, which may require that a reset can be initiated even when the system clock is not running.

A signal may be any physical quantity carrying information, for example a voltage changing over time, wherein for example one or more voltage levels may be associated with certain meanings. For example, a reset signal may comprise at least two different signal levels, wherein one level or a level change is associated with information causing the device receiving the reset signal to perform a reset. Asserting a reset may refer to changing the level of the reset signal in order to cause the receiving device to perform the reset. De-asserting the reset may refer to changing the reset signal level (back) to a level not associated with a reset command.

Reset signals for electronic systems may be issued asynchronously or synchronously with a second signal such as the system clock signal. In electronics and especially synchronous digital circuits, a clock signal is a particular type of signal that for example oscillates between a high and a low state and is utilized like a metronome to coordinate actions of circuits and synchronize application of signals to synchronous or clocked circuits, such as for example flip-flop circuits, for example in a processing device, or clocked memory devices, such as random access memory (RAM) devices.

Initiating a reset even when the system clock is not running may be handled by an asynchronous reset signal independently of the current state of the system clock, routed to, for example, all flip-flop circuits, which may comprise an asynchronous reset input, for example for power-on initializing of the flip-flop. Other clocked devices, for example RAM devices, may not comprise asynchronous reset inputs and may for example be driven by flip-flop outputs.

In U.S. Pat. No. 6,237,090 a synchronous or asynchronous resetting circuit is shown, wherein a reset assertion is applied synchronously with the clock signal if a clock signal is detected within a fixed time window after the input reset signal assertion, otherwise the reset is asserted asynchronously, i.e. the asynchronous reset path is activated after a certain delay regardless of the condition of the clock.

In U.S. Pat. No. 7,449,926 a circuit for asynchronously resetting a synchronous circuit is shown, wherein separate signals for asynchronous and synchronous reset are generated, each using different routing through different wiring for applying the first and second reset signal to a receiving device.

In U.S. Pat. No. 7,626,420 a system for synchronously resetting logic circuits is shown, wherein the reset de-assertion is synchronized with a clock signal.

SUMMARY OF THE INVENTION

The present invention provides an electronic circuit, a safety critical system and a method for providing a reset signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated, for the understanding and appreciation of the underlying concepts of the present invention and in order not to obfuscate or distract from the teachings of the present invention.

Figure 1:
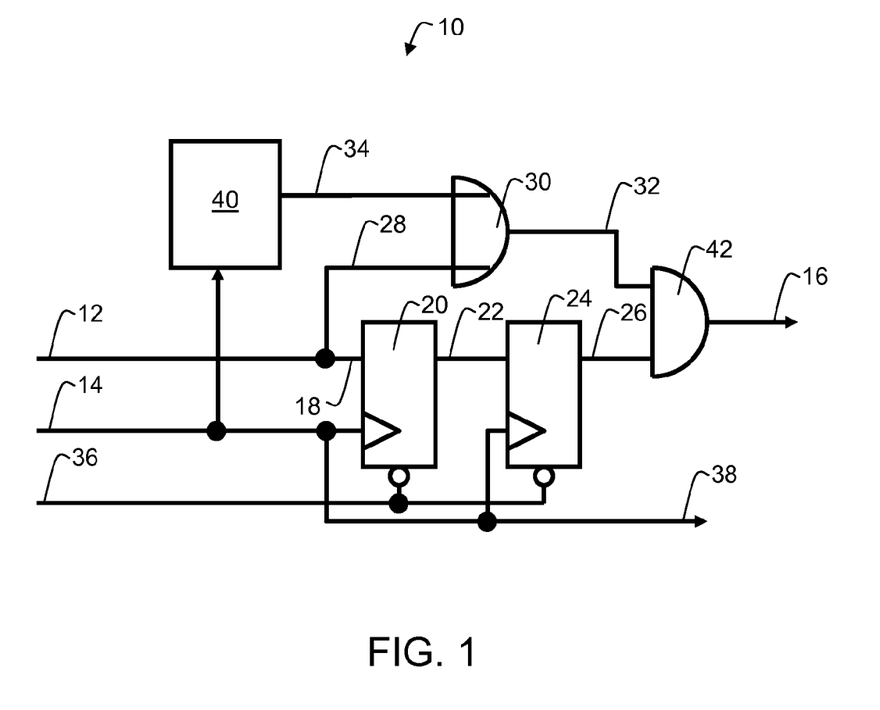
FIG. 1 schematically shows an example of a first embodiment of an electronic circuit.

Referring to FIG. 1, an example of a first embodiment of an electronic circuit is shown. An electronic circuit may for example comprise flip-flop circuits, latches, logic circuits or other circuitry and may for example be composed of individual electronic components, such as transistors, diodes, resistors, capacitors or inductors, connected by conductive wires or traces through which electrical current can flow. It may for example be completely or partly be implemented using one or more integrated circuits, i.e miniaturized electronic circuits manufactured in the surface of a substrate of semiconductor material, consisting mainly of semiconductor devices and passive components.

The shown electronic circuit 10 comprises a reset input 12 for receiving an input reset signal, a clock input 14 for receiving a clock signal, and a reset output 16 for providing an output reset signal. The electronic circuit 10 comprises a synchronous reset signal path 18, 20, 22, 24, 26 comprising a synchronization unit 20, 24, arranged to receive the input reset signal and provide the input reset signal synchronized with the clock signal to the reset output 16, i.e. as the reset output signal, when the clock signal is available; and an asynchronous reset signal path 28, 30, 32 arranged to provide the input reset signal to the reset output 16 when a current clock availability information in a clock monitoring signal 34 indicates that the clock signal is not available.

The input reset signal may be any reset signal, for example asserting reset synchronized with a clock signal level change, or may be asynchronous and independent of the clock signal state.

A reset signal path may for example be a connecting line for transmitting a reset signal from the reset input 12 to the reset output 16. As shown, a reset signal path may comprise additional devices for transmitting the reset signal, thereby potentially changing or processing the input reset signal to generate the output reset signal. A reset signal may be asserted in order to trigger a reset of a device receiving the reset signal from the reset output 16, or de-asserted.

An asynchronous reset signal path 28, 30, 32 may not comprise any synchronous devices requiring a clock signal for transmitting or processing the input reset signal to provide the output reset signal. It may for example comprise other circuitry such for example the shown logic OR circuit 30, connected to provide an asynchronous reset signal received in a first part 28 of the asynchronous reset signal path 28, 30, 32 to a second part 32 of the asynchronous reset signal path, if the clock monitoring signal 34 indicates a non-availability of a clock signal at the clock signal input 14. In the shown example layout the logic signalling concept may be based on asserted/active low, de-asserted/inactive high reset signal levels, whereas an available clock signal may result in an active high clock monitoring signal 34 level.

A synchronous reset signal path 18, 20, 22, 24, 26 may comprise at least one synchronous, clocked device, such as the shown synchronization unit 20, 24 for providing an output reset signal synchronized with the clock signal, if received by the clocked device.

A clock signal may be available when it is received having a signal property capable of regularly triggering a clocked device. An available clock signal may for example oscillate between a high and a low signal level or state. A clock signal may be considered not available for example when the signal does not oscillate, but remains either in high or low state or in another, e.g. zero, level, or when abnormal signal changes cause any malfunction of the clocked devices.

A clock monitoring signal may be generated from monitoring the quality and availability of the clock signal and may at least comprise a current clock availability information. For example, a two-level binary clock monitoring signal may have a first level associated with the information "clock signal available" and a second level associated with the information "clock signal not available". In other embodiments, more detailed status information for the clock signal may be signalled with the clock monitoring signal.

The shown circuit may comprise a power-on reset input 36 connected to reset inputs of the synchronization unit 20, 24, allowing for initializing the synchronization unit 20, 24 into a known state, for example during power-on, i.e. during initial application of power to the circuit.

And the electronic circuit 10 may comprise a clock signal output 38 connected to the clock signal input 14 for transmitting the clock signal to other circuits, such as for example a processing device, for example connectable to receive the output reset signal provided at the reset output 16.

The clock monitoring signal 34 may not be generated for example on demand for example when no output reset signal is generated although an input reset signal had been issued and provided to the electronic circuit or when other devices connected the output reset fail to return into a defined state due to not receiving the issued reset signal. The clock monitoring signal 34 may continuously provide the current clock availability information. For this, the clock signal input 14 may be continuously monitored. This may for example allow for continuously monitoring and instantly detecting non-availability of the clock signal instead of longer delay times until a clock failure may have been reliably detected. This may allow for continuous coverage of the clock signal condition and a fast response and directing an incoming reset signal to the asynchronous reset path 28, 30, 32 and asynchronously providing an input reset signal without delay to the reset signal output 16. The electronic circuit 10 may offer a clock synchronous assertion of an asynchronous reset signal in case a clock is present, or a purely asynchronous reset in case the clock is stalled.

The electronic circuit 10 may comprise a clock monitoring unit 40 connected to the clock input 14 and arranged to provide the clock monitoring signal 34. A clock monitoring unit (CMU) may be a device for detecting the presence of the clock. It may already be available as part of many devices, for example microcontroller units. This may reduce additionally needed wiring and die area, when implementing the CMU in an integrated circuit. The CMU 40 may continuously provide the clock monitoring signal 34 and may allow detecting a loss-of-clock condition in the system very early.

In another embodiment, the electronic circuit may not comprise a CMU itself but may comprise a clock monitoring input for receiving the clock monitoring signal 34, i.e. an external CMU, for example located on a different device, may be arranged to monitor the clock signal and may be connected to provide the clock monitoring signal to the clock monitoring input. The clock signal may for example be the system clock signal distributed to a variety of different circuits, and connecting to an available CMU may for example be area efficient or power efficient.

Both if the electronic circuit comprises a CMU 40, as shown in FIG. 1, for providing the clock monitoring signal 34 or if the clock monitoring signal is received through a clock monitoring input, the clock monitoring signal may be arranged not to instantaneously change the current clock availability information when a non-availability of the clock signal is detected. The current clock availability information may change delayed by a delay time after the clock signal ceases. The delay may be generated for example based on an internal clock or delay circuit of the CMU. If the output reset signal is asynchronous and provided for example to a synchronous device such as a RAM device, a flip-flop output could change at any time which may result in setup or hold time problems at the RAM inputs. This may lead to the content of the RAM becoming unknown and probably unusable. The described approach may allow robust asynchronous resets, which are mandatory in safety architectures, across a circuit or a whole chip while providing guaranteed RAM content after reset exit and avoiding RAM re-initialization after reset. The system may be robust in itself, if the clock monitor does not de-assert the clock monitoring signal 34 immediately after the clock ceases operation and the output reset signal is not asserted before the CMU 40 de-asserts the clock monitoring signal 34. The shown circuit may for example allow the usage of an asynchronous reset signal for flip-flop circuits without jeopardizing setup and hold times of non-reset synchronous blocks such as for example RAM devices driven by asynchronous resettable flip-flop circuits.

Figure 2:
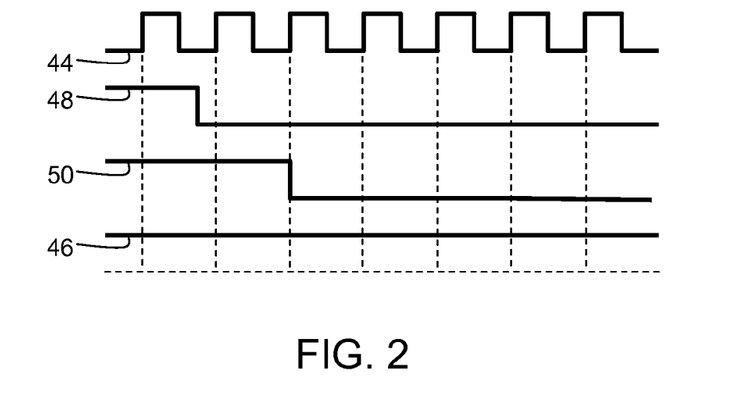
FIG. 2 schematically shows an example of a timing diagram for synchronous resetting according to the first embodiment of an electronic circuit.

Referring now also to FIG. 2, an example of a timing diagram, wherein signal states (vertical axis), for example voltage levels, are schematically illustrated over time (horizontal axis), for synchronous resetting according to the first embodiment of an electronic circuit is schematically shown, wherein the logic signalling concept is based on asserted/active low, de-asserted/inactive high reset signal levels, whereas an available clock signal is signalled as an active high clock monitoring signal 34 level.

As shown, a clock signal 44 may be available, causing the clock monitoring signal 46 to remain in active high state. An input reset signal 48 is asserted asynchronously, i.e. not aligned with the beginning of a new clock cycle of the clock signal 44. The output reset signal 50 is asserted synchronized with the beginning of a clock cycle and delayed by more than one clock cycle. The electronic circuit 10 shown in FIG. 1 may have the synchronization unit 20, 24 arranged to provide the output reset signal 50 delayed by at least a duration of a cycle of the clock signal 44. This may help avoid undefined situations: Although shown as instantaneous changes of signal levels, each circuit requires a certain time for executing adaptation to a signal level change. Hence, during this short period instantaneous reset assertion may leave the circuit in an undefined state. If for example the clock signal is the system clock used for example for synchronously writing data to a memory, such as a RAM device, reset assertion during this period may result in an undefined situation, whether or not the write attempt succeeded, introducing uncertainty to the RAM content. Delaying assertion of the reset signal may avoid overlapping of reset and state change periods.

Figure 3:
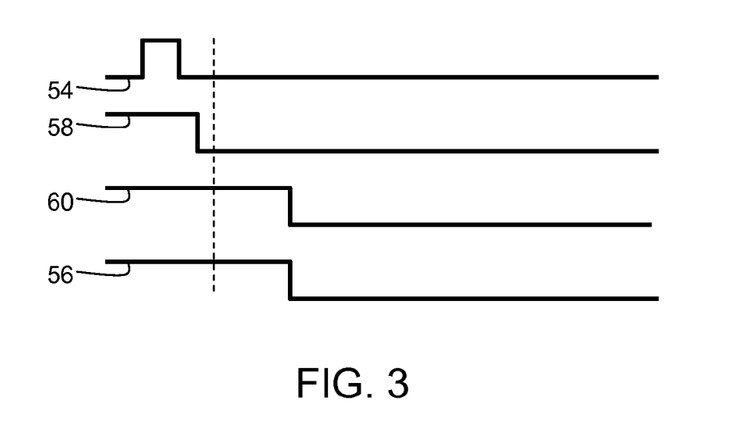
FIG. 3 schematically shows a first example of a timing diagram for asynchronous resetting according to the first embodiment of an electronic circuit.
Figure 4:
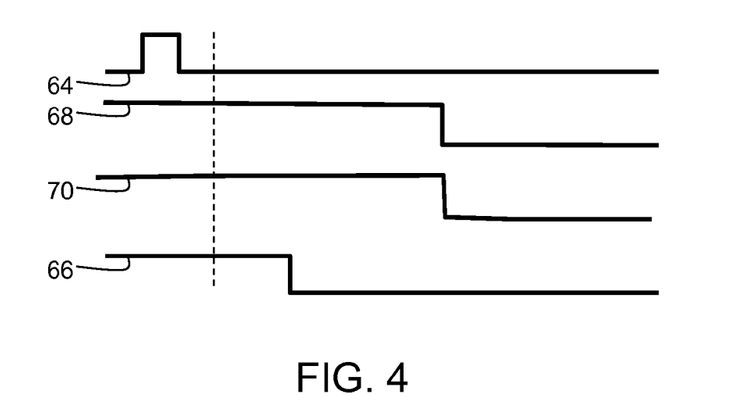
FIG. 4 schematically shows a second example of a timing diagram for synchronous resetting according to the first embodiment of an electronic circuit.

Referring now also to FIG. 3 and FIG. 4, a first and a second example of a timing diagram for asynchronous resetting according to the first embodiment of an electronic circuit is schematically illustrated. The shown asynchronous assertion in case of no clock may comprise that the current clock availability information may change delayed by a delay time after the clock signal 54, 64 ceases, i.e. the state change of the clock monitoring signal 56, 66 is delayed compared to the end of the last detected clock cycle (dashed line). As shown in FIG. 3, the clock signal 54 ceases, but an asynchronous input reset signal is received before the clock monitoring signal 56 indicates non-availability of the clock signal. The assertion of the output reset signal 60 is therefore delayed by a delay time until the clock monitoring signal 56 is set to low level. Since during this last clock cycle, for example a write access to a memory device may be performed, the delay time may be at least as long as a duration of a cycle of the clock signal. The delay may for example be generated using an internal clock of a CMU monitoring the clock signal 54, which may be the system clock signal. As shown in FIG. 4, the asynchronous input reset signal 68 may be asserted after the clock monitoring signal 66 is set to low indicating non-availability of the clock signal 64. No more write operations may be currently carried out, and the assertion of the output reset signal may not be delayed if the clock is not available.

Referring again to FIG. 1, the synchronization unit 20, 24 may comprise at least two flip-flop circuits, receiving the input reset signal and the clock signal, connected in series for generating the output reset signal synchronized with the next clock cycle and delayed by one more clock cycles. There may be no need for a delay generated for example by an RC circuit. The shown two-flip-flop synchronizing unit 20, 24 may synchronize both the assertion and the de-assertion of the original asynchronous input reset signal to the received clock signal. In case of no clock signal, the synchronous reset signal path 18, 20, 22, 24, 26 may be blocked due to the flip-flop circuits 20, 24 not or no longer receiving a clock signal as a trigger for state switching.

As shown in FIG. 1, the asynchronous reset signal path 28, 30, 32 may be arranged not to provide an output reset signal when the current clock availability information indicates that the clock signal is available. As long as clock monitoring signal 34 is not set to low, logic OR circuit 30 may not provide an asserted, i.e. low in the shown embodiment, reset signal to the second part 32 of the asynchronous reset signal path. If the clock signal is available, the asynchronous reset path may be completely blocked.

The asynchronous reset signal path 28, 30, 32 and the synchronous reset signal path 18, 20, 22, 24, 26 may be connected to the reset output 16 via a selection circuit 42 arranged to connect either the asynchronous 28, 30, 32 or the synchronous reset signal path 18, 20, 22, 24, 26 to the reset output 16. In the embodiment of an electronic circuit 10 shown in FIG. 1 the selection circuit 42 may be a logic AND gate. The resultant reset signal provided to the reset signal output 16 may be the logical combination of the synchronized input reset signal, the original asynchronous input reset signal, and the output of the clock monitoring unit 40 such that when the clock signal is present, the resultant output reset signal is asserted by the synchronized reset provided by the synchronous reset signal path 18, 20, 22, 24, 26, and when the clock is not present, the output reset signal is asserted by the asynchronous reset provided by the asynchronous reset signal path 28, 30, 32. Either the asynchronous or the synchronous reset signal path may be active at a given time, since the selection may be done based on the clock condition, independent of the time it takes to determine the clock quality and of a reset input assertion time. The shown system may allow having a synchronous reset as long as the respective system clock is operating and having an asynchronous reset otherwise, using a single output reset signal. Or the asynchronous reset signal path may be active, while the synchronous reset signal path may be active, too, wherein the timing may be determined by the asynchronous reset signal path.

Only one output reset signal is provided for both synchronous and asynchronous reset, which may allow re-using existing reset wiring and help avoid additional reset wiring overhead for providing different reset signals, and to eliminate race conditions due to unequal delays on separate synchronous and the asynchronous reset signal paths.

Implementing the shown electronic circuit may result in no additional constraints for example on a chip's RTL (Register Transfer Level) code, synthesis, place and route, timing analysis or optimization and may for example be carried out withoutintroducing additional global signals. Since in modern design for example of a MCU, the reset signal may be balanced like a clock tree in the chip to ensure the timing of its synchronous de-assertion. Adding the assertion edge to this constraint may not require any changes. No additional wiring may be necessary to the rest of the chip.

Figure 5:
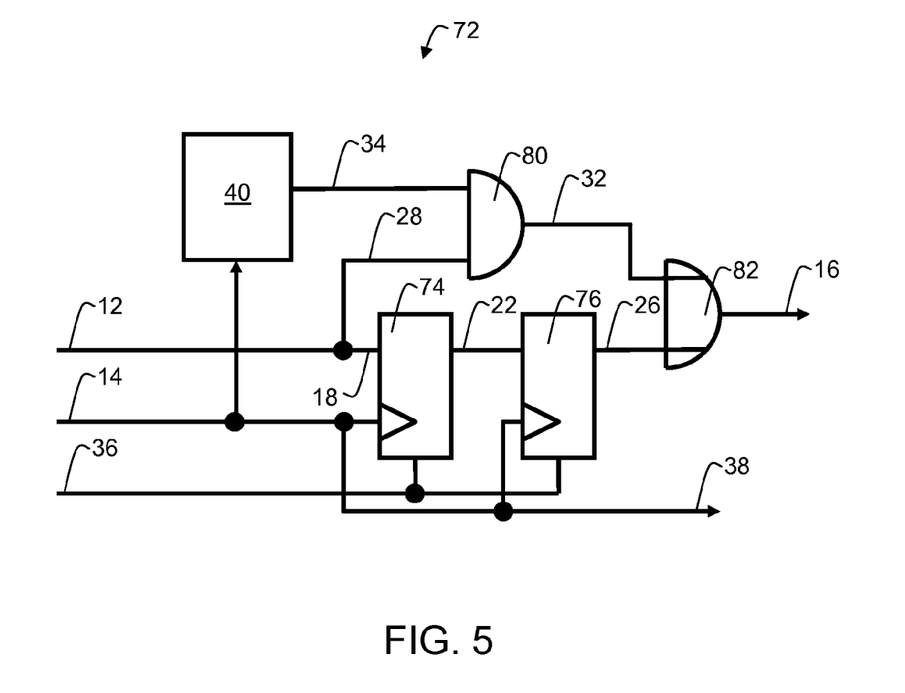
FIG. 5 schematically shows an example of a second embodiment of an electronic circuit.

Referring now also to FIG. 5, an example of a second embodiment of an electronic circuit is schematically shown. Only elements different from the elements shown in FIG. 1 will be explained in more detail. Like reference numbers are used to identify like or functionally similar elements. In the shown example layout of an electronic circuit 72, the logic signalling concept may be based on asserted/active high, de-asserted/inactive low reset signal levels, whereas an available clock signal may result in an active low clock monitoring signal 34 level. Here the synchronization unit 74, 76 may be arranged similar to the synchronization unit shown in FIG. 1. Flip-flop circuits may have a non-inverting input for receiving power-on initial reset. However, depending on the chosen initial reset signal, flip-flop circuits as shown for example in FIG. 1 may be used. The shown asynchronous reset signal path 28, 80, 32 may comprise a logic AND gate 80 for providing the asynchronous reset signal to the second part 32 of the asynchronous reset signal path only when the clock monitoring signal 34 indicates non-availability of a clock signal at clock signal input 14. For the example of an electronic circuit 72 shown in FIG. 5, the clock monitoring signal 34 may be high when signalling that the clock signal is not available. The selection circuit 82 may for example be a logic OR gate for connecting either the asynchronous 28, 80, 32 or the synchronous 18, 74, 22, 76, 26 reset signal path to the reset signal output 16.

Figure 6:
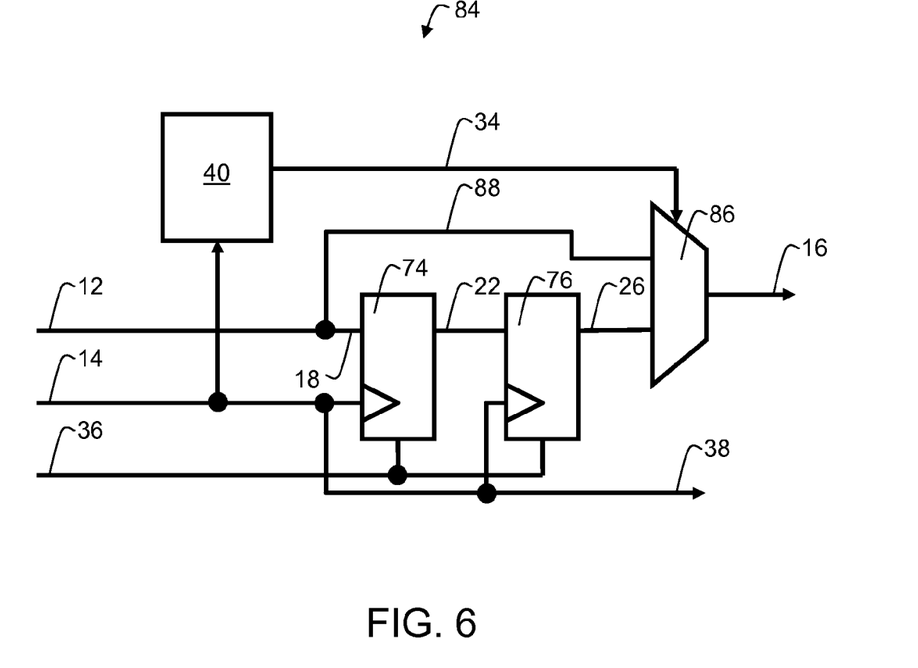
FIG. 6 schematically shows an example of a third embodiment of an electronic circuit.

Referring now also to FIG. 6, an example of a third embodiment of an electronic circuit 84 is schematically shown. Only elements different from the elements shown in FIG. 5 will be explained in more detail. Like reference numbers are used to identify like or functionally similar elements. In the shown embodiment, instead of using a logic combination of AND and OR gates, the selection unit 86 may be a multiplexer unit 86 or other switching device. This may allow simplifying the asynchronous reset signal path 88 to a single connecting line between the reset signal input 12 and the multiplexer unit 86, while the clock monitoring signal 34 may control whether to connect the asynchronous or the synchronous reset signal path to the reset signal output 16. The clock monitoring signal 34 may be active high or low to indicate that clock signal is available and the multiplexer unit 86 may select the asynchronous 88 or synchronous 18, 74, 22, 76, 26 reset signal path accordingly. In another embodiment, the multiplexer unit 86 may receive or additionally receive a control or selection signal from outside the electronic circuit 84, for example in a special mode, for selecting one of the reset signal paths independently of the clock monitoring signal 34.

Figure 7:
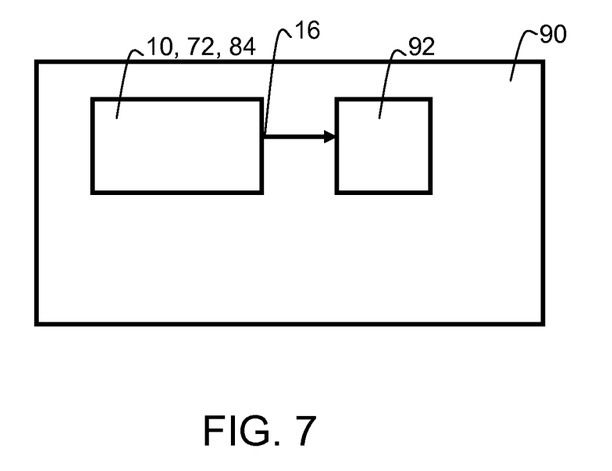
FIG. 7 schematically shows an example of an embodiment of a safety critical system.

The electronic circuit 10, 72, 84 may be provided partly or completely using for example one or more integrated circuits. In one embodiment, the electronic circuit 10, 72, 84 may be provided as a single integrated circuit, for example integrated in a circuit die of a microprocessor unit or other processing device, which may allow for efficient production and re-using of existing wiring. Referring now also to FIG. 7, an example of an embodiment of a safety critical system 90 is illustrated. A safety critical system 90 may comprise an electronic circuit 10, 72, 84 as described above. In an embodiment of the system, the safety critical system may comprise at least one clocked device 92, for example a processing device such as an MCU, connectable to a memory device, such as a RAM device, arranged to receive the output reset signal, for example through reset signal output 16. Microcontrollers need a reset to properly start or return to a known state in case of problems with, for example, the state machine. Safety critical systems may require that a reset can be initiated even when the system clock is not running. This may for example be handled by an asynchronous reset routed to all flip-flops. Without using reset signals generated according to the electronic circuit described above, this may impose an issue in case the output of those flip-flops drives the input of a clocked block, like a RAM, which may have either no reset or a different reset. As the reset may be asynchronous, the flip-flop outputs may change at any time resulting in hazardous setup or hold time violations at the RAM inputs and may lead to the content of the RAM becoming unknown.

Provision of asynchronous resets in a system comprising synchronous and probably asynchronous devices may be especially important in safety critical systems, which may require that a reset can be initiated even when the system clock is not running, in order to restart the system as soon as possible and if possible without losing certain information, for example critical information, of the system. A safety critical system may for example be part of electronic equipment of a power plant or a vehicle. A vehicle may for example be a car, a plane, a ship, a helicopter etc. A safety critical system may for example comprise a memory device and a processing device, for example a microcontroller unit. A vehicle safety critical system may for example comprise an engine control unit (ECU). An ECU is an electronic control unit which controls various aspects of an internal combustion engine's operation. An ECU may for example control the quantity of fuel injected into each cylinder. An ECU may for example also control the ignition timing, variable valve timing (VVT), the level of boost maintained by the turbocharger (in turbocharged cars), and other peripherals. However, a safety critical system may be found in a non-automotive environment. Or an automotive safety critical system may be, for example, a car safety system. A safety critical system may comprise a seat position control system, lighting, airbags, windscreen wipers, immobilizers, electronic climate control, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. However, the provided electronic circuit for providing a reset signal may also be used for other car systems, such as for example electric window lift, where a restart may result in a dangerous situation, if the current window position is lost at restart.

Figure 8:
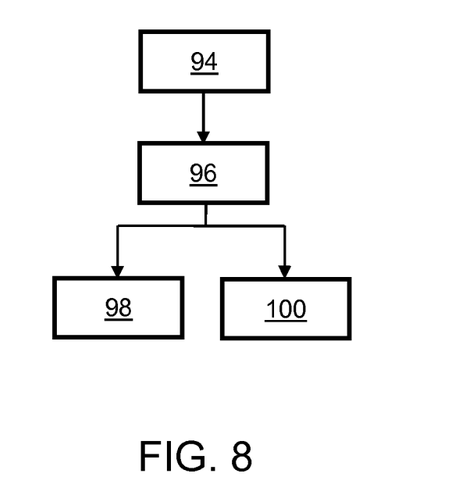
FIG. 8 schematically shows a diagram of an example of an embodiment of a method for providing a reset signal.

Referring now to FIG. 8, a diagram of an example of an embodiment of a method for providing a reset signal is schematically shown. A method for providing a reset signal may comprise receiving 94 an input reset signal, monitoring 96 availability of a clock signal and generating a clock monitoring signal comprising a current clock availability information, providing 98 the input reset signal synchronized with the clock signal as an output reset signal when the clock signal is available, and providing 100 the input reset signal asynchronously as the output reset signal when the current clock availability information indicates that the clock signal is not available. The illustrated method allows implementing the advantages and characteristics of the described electronic circuit as part of a method for providing a reset signal.

In an embodiment of the method, the step of providing the input reset signal asynchronously as the output reset signal when the current clock availability information indicates that the clock signal is not available may comprise delaying a change of the current clock availability information by a delay time after the clock signal ceases.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the synchronization unit 20, 24 may be implemented using more or less than two flip-flop circuits or logic circuitry other than gates 30, 42 may be used to achieve the same logic functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the electronic circuit 10 may be implemented on a single integrated circuit. Alternatively, the example may be implemented as any number of separate integrated circuits or separate devices interconnected with each other in a suitable manner. For example, the clock monitoring unit 40 of the electronic circuit 10 may be implemented as a separate integrated circuit.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non -programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. An electronic circuit, comprising:
   a reset input for receiving an input reset signal;
   a clock input for receiving a clock signal;
   a reset output for providing an output reset signal;
   a synchronous reset signal path comprising a synchronization unit, arranged to receive said input reset signal and provide said input reset signal synchronized with said clock signal to said reset output when said clock signal is available; and
   an asynchronous reset signal path arranged to provide said input reset signal to said reset output when a current clock availability information in a clock monitoring signal indicates that said clock signal is not available.

2. The electronic circuit as claimed in claim 1, wherein said clock monitoring signal continuously provides said current clock availability information.

3. The electronic circuit as claimed in claim 2, comprising a clock monitoring unit connected to said clock input and arranged to provide said clock monitoring signal.

4. The electronic circuit as claimed in claim 2, wherein said current clock availability information changes delayed by a delay time after said clock signal ceases.

5. The electronic circuit as claimed in claim 1, comprising a clock monitoring unit connected to said clock input and arranged to provide said clock monitoring signal.

6. The electronic circuit as claimed in claim 1, comprising a clock monitoring input for receiving said clock monitoring signal.

7. The electronic circuit as claimed in claim 1, wherein said current clock availability information changes delayed by a delay time after said clock signal ceases.

8. The electronic circuit as claimed in claim 7, wherein said delay time is at least as long as a duration of a cycle of said clock signal.

9. The electronic circuit as claimed in claim 7, wherein said synchronization unit is arranged to provide said output reset signal delayed by at least a duration of a cycle of said clock signal.

10. The electronic circuit as claimed in claim 7, wherein said asynchronous reset signal path is arranged not to provide an output reset signal when said current clock availability information indicates that said clock signal is available.

11. The electronic circuit as claimed in claim 7, wherein said asynchronous reset signal path and said synchronous reset signal path are connected to said reset output via a selection circuit arranged to connect either said asynchronous or said synchronous reset signal path to said reset output.

12. The electronic circuit as claimed in claim 1, wherein said synchronization unit is arranged to provide said output reset signal delayed by at least a duration of a cycle of said clock signal.

13. The electronic circuit as claimed in claim 1, wherein said synchronization unit comprises at least two flip-flop circuits.

14. The electronic circuit as claimed in claim 1, wherein said asynchronous reset signal path is arranged not to provide an output reset signal when said current clock availability information indicates that said clock signal is available.

15. The electronic circuit as claimed in claim 1, wherein said asynchronous reset signal path and said synchronous reset signal path are connected to said reset output via a selection circuit arranged to connect either said asynchronous or said synchronous reset signal path to said reset output.

16. The electronic circuit as claimed in claim 1, wherein said electronic circuit is provided as a single integrated circuit.

17. A safety critical system, comprising an electronic circuit as claimed in claim 1.

18. The safety critical system as claimed in claim 17, comprising at least one clocked device arranged to receive said output reset signal.

19. A method for providing a reset signal, comprising:
   receiving an input reset signal;
   monitoring availability of a clock signal and generating a clock monitoring signal comprising a current clock availability information;
   providing said input reset signal synchronized with said clock signal as an output reset signal when said clock signal is available; and
   providing said input reset signal asynchronously as said output reset signal when said current clock availability information indicates that said clock signal is not available.

20. The method as claimed in claim 19, wherein said providing said input reset signal asynchronously as said output reset signal when said current clock availability information indicates that said clock signal is not available comprises delaying a change of said current clock availability information by a delay time after said clock signal ceases.

* * * * *